United States Patent [19]
Goenka

[11] Patent Number: 5,390,450
[45] Date of Patent: Feb. 21, 1995

[54] SUPERSONIC EXHAUST NOZZLE HAVING REDUCED NOISE LEVELS FOR $CO_2$ CLEANING SYSTEM

[75] Inventor: Lakhi N. Goenka, Ann Arbor, Mich.

[73] Assignee: Ford Motor Company, Dearborn, Mich.

[21] Appl. No.: 148,233

[22] Filed: Nov. 8, 1993

[51] Int. Cl.[6] .............................................. B24C 5/04
[52] U.S. Cl. ....................... 451/75; 451/102; 451/39; 451/53
[58] Field of Search .............. 51/439, 410, 319, 320, 51/321, 322

[56] References Cited

U.S. PATENT DOCUMENTS

| | | | |
|---|---|---|---|
| 2,666,279 | 1/1954 | Chalom | 51/439 |
| 3,878,978 | 4/1975 | Martinke | 225/1 |
| 3,982,605 | 9/1976 | Scheckenberger | 51/439 |
| 4,038,786 | 8/1977 | Fong | 51/320 |
| 4,519,812 | 5/1985 | Brull et al. | 51/422 |
| 4,631,250 | 12/1986 | Hayashi | 430/329 |
| 4,747,421 | 5/1988 | Hayashi | 134/201 |
| 4,806,171 | 2/1989 | Whitlock et al. | 134/7 |
| 4,828,184 | 5/1989 | Gardner et al. | 239/590.3 |
| 4,932,168 | 6/1990 | Tada et al. | 51/436 |
| 4,962,891 | 10/1990 | Layden | 239/597 |
| 5,018,667 | 5/1991 | Lloyd | 239/132.5 |
| 5,111,984 | 5/1992 | Niedbala | 225/1 |

FOREIGN PATENT DOCUMENTS 8900809 11/1990 Netherlands ................ 51/439

Primary Examiner—Robert A. Rose
Attorney, Agent, or Firm—Richard D. Dixon; Roger L. May

[57] ABSTRACT

A $CO_2$ nozzle receives and expels liquid $CO_2$ through orifices sized for converting the $CO_2$ liquid into $CO_2$ snow. A body, defining an elongated cavity therein, is coupled to the $CO_2$ nozzle such that the $CO_2$ snow is ejected into the cavity. An exhaust nozzle is coupled to the body and the cavity therein for directing the pressurized $CO_2$ snow toward the workpiece. The exhaust nozzle is operated in an overexpanded mode for containing the shockwave within the nozzle for reducing the shear noise therefrom. Pressurized air is injected into the elongated cavity for exhausting the $CO_2$ snow under pressure.

6 Claims, 6 Drawing Sheets

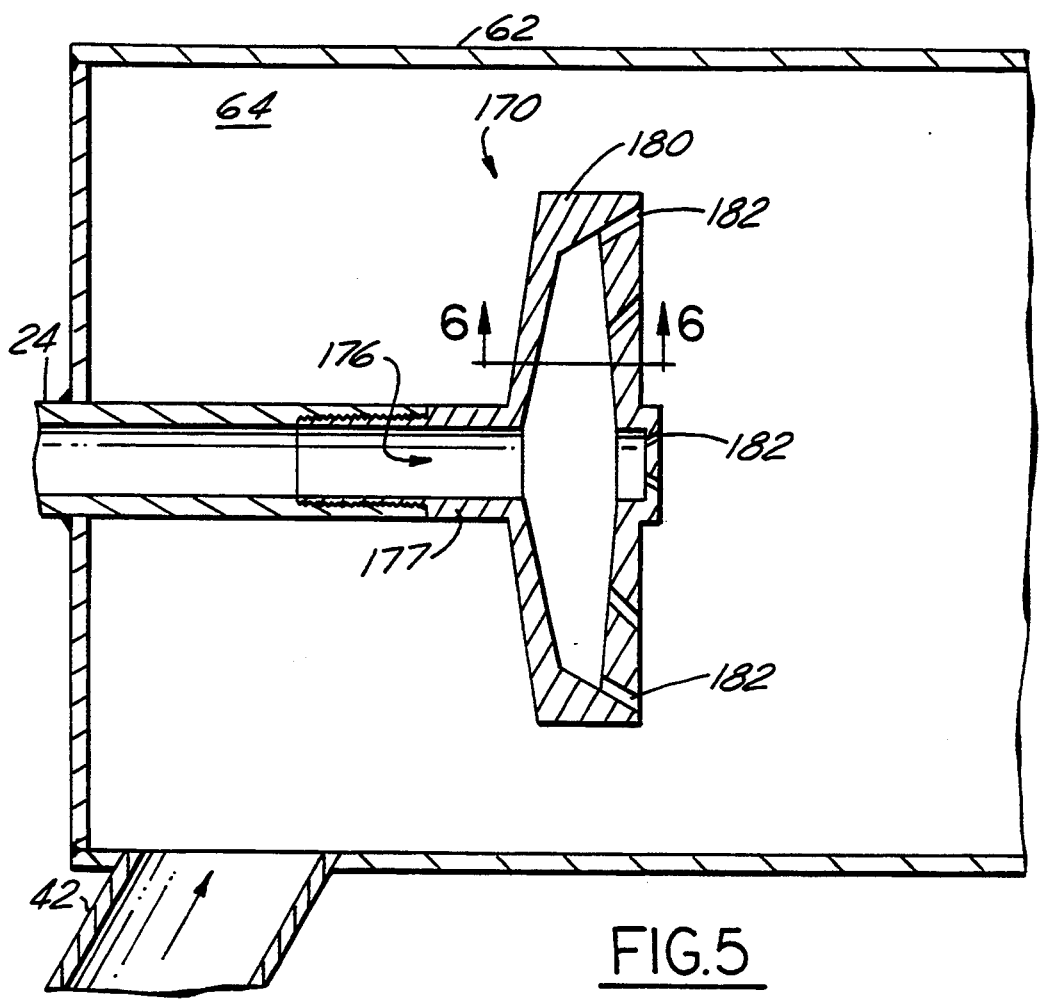
FIG.5
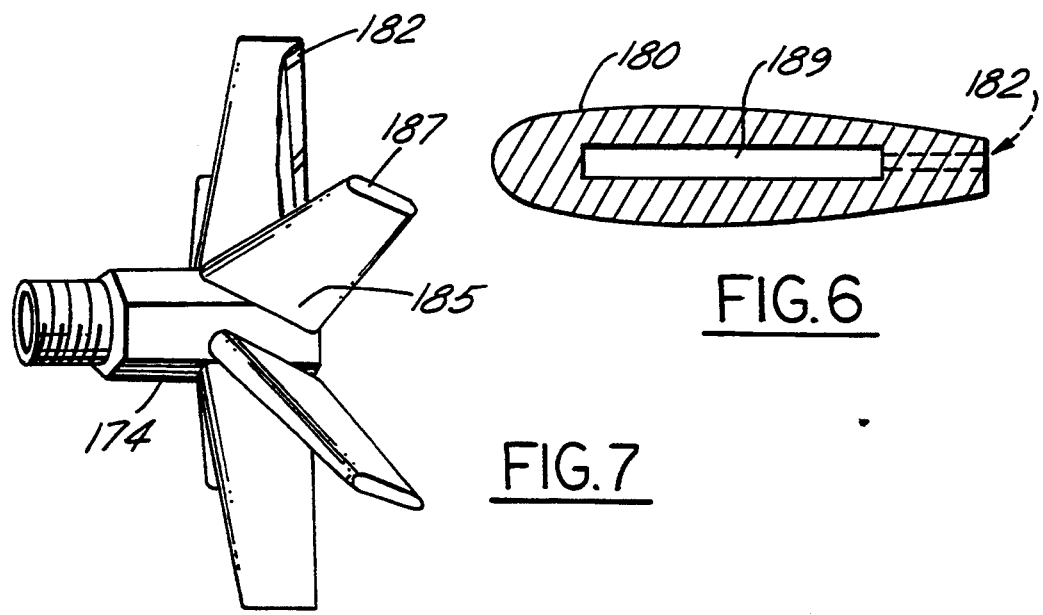
FIG.6
FIG.7

SUPERSONIC EXHAUST NOZZLE HAVING REDUCED NOISE LEVELS FOR CO₂ CLEANING SYSTEM

FIELD OF THE INVENTION

The present invention relates to a nozzle and method for creating abrasive $CO_2$ snow at supersonic speeds and reduced noise levels and for directing the snow onto an area of contaminants to be removed from a workpiece.

BACKGROUND OF THE INVENTION

The use of liquid carbon dioxide for producing $CO_2$ snow and subsequently accelerating it to high speeds for cleaning particles from a substrate is taught by Layden in U.S. Pat. No. 4,962,891. A saturated $CO_2$ liquid having an entropy below 135 BTU per pound is passed though a nozzle for creating, through adiabatic expansion, a mix of gas and $CO_2$ snow. A series of chambers and plates are used to enhance the formation of larger droplets of liquid $CO_2$ that are then converted through adiabatic expansion into solid $CO_2$ "snow". The walls of the ejection nozzle are suitably tapered at an angle less than 15 degrees so that the intensity or focus of the stream of the solid/gas $CO_2$ will not be reduced below that which is necessary to clean the workpiece. The nozzle, which may be manufactured of fused silica or quartz, does not utilize any precooling.

Lloyd, in U.S. Pat. No. 5,018,667 at columns 5 and 7, teaches the use of multiple nozzles and tapered concentric orifices for controlling the flow of the $CO_2$ and snow mixture. These references seek to disperse the snow rather than to focus it after exiting the exhaust nozzle. Lloyd teaches that a small portion of the liquid $CO_2$ is routed through a pilot orifice and then into an expansion cavity for allowing the liquid $CO_2$ to flash from the liquid to the solid state, which in turn causes a significant drop in temperature. This cooled mixture of solid, liquid and gas cools the inside surface of the nozzle, which then cools the remainder of the nozzle through conduction. This cooling acts as a constant temperature heat sink that precools the liquid $CO_2$ as it enters the primary orifices in the body, which in turn enhances the conversion of the main flow of the liquid $CO_2$ flowing through the primary orifices of the nozzle. No precooling gases are used in the vicinity of the nozzle to improve the flashing conversion of the liquid into the solid phase.

Hayashi, in U.S. Pat. Nos. 4,631,250 and 4,747,421, discloses the use of liquified nitrogen ($N_2$) for cooling a jacket-type peripheral wall defining a sealed cavity in which a flow of $CO_2$ gas is introduced under pressure. The cooling produced by the cooled peripheral walls causes the $CO_2$ to change into snow within the chamber. $N_2$ gas is introduced into the chamber at high pressure in order to agitate and carry the $CO_2$ snow from the chamber at high velocity though a jetting nozzle. While liquid $N_2$ is used for cooling the peripheral walls, the ambient $N_2$ is used only for agitating and transporting the $CO_2$ snow from the cooled cavity.

In contrast to these prior art teachings, the present invention utilizes inexpensive components and readily available low pressure air for improving the efficiency of creating $CO_2$ snow and for improving the coagulation of the $CO_2$ snow into larger $CO_2$ snow particles. A supersonic nozzle operated in the overexpanded mode is utilized to focus the $CO_2$ snow onto the workpiece while reducing the shear noise produced by the pressurized exhaust.

SUMMARY OF THE INVENTION

In an apparatus for cleaning a workpiece with abrasive $CO_2$ snow, a nozzle receives and expels liquid $CO_2$ through an orifice sized for converting the liquid $CO_2$ into $CO_2$ snow. A body, defining an elongated cavity therein, is coupled to the nozzle for receiving the $CO_2$ snow into the elongated cavity. Pressurized air is injected into the elongated cavity for exhausting the $CO_2$ through an exhaust nozzle that is coupled to the body and the cavity therein for directing the pressurized $CO_2$ snow toward the workpiece. The exhaust nozzle is operated in an overexpanded mode for containing the normal shockwave within the nozzle, and thereby reducing the shear noise therefrom.

BRIEF DESCRIPTION OF THE DRAWINGS

Other objects, features and advantages of the present invention will be apparent from a study of the written descriptions and the drawings in which:

FIG. 5 is a cross-sectioned view of an improved $CO_2$ snow generated nozzle including a plurality of wings.

FIG. 6 is a cross-sectioned view of one of the wings taken along section lines 6—6 in FIG. 5.

FIG. 7 is a perspective view of the $CO_2$ snow generating nozzle and circumferential wings shown in FIG. 5.

DESCRIPTION OF THE PREFERRED EMBODIMENT AND METHOD

Figure 1:
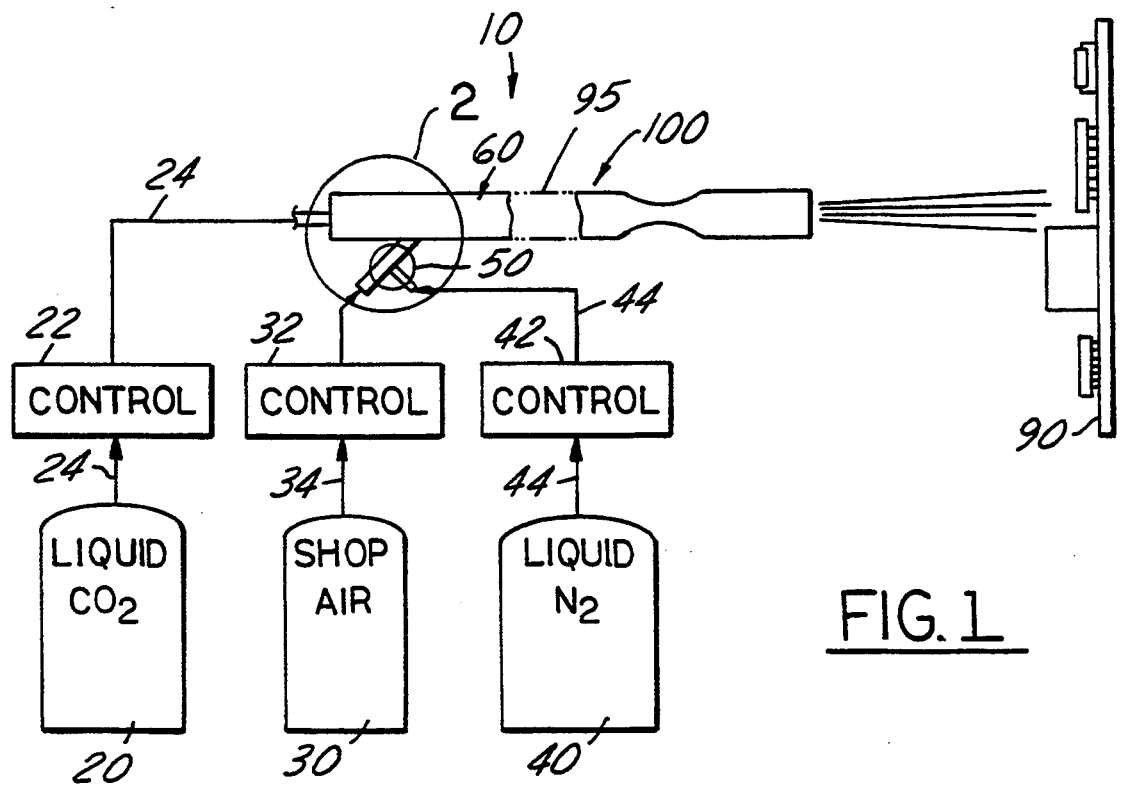
FIG. 1 is a pictorial diagram of the $CO_2$ cleaning system in accordance with the present invention as it operates on a printed circuit board workpiece.

A $CO_2$ cleaning system in accordance with the present invention is illustrated generally in FIG. 1. A $CO_2$ snow generator 10 is connected to a reservoir 20 of liquid $CO_2$, a source of compressed shop air 30 and a source of liquid nitrogen $N_2$ 40. The solid $CO_2$ snow which is exhausted from the exhaust nozzle of the $CO_2$ generator 10 is focused on the workpiece 90 shown generally as a printed circuit board of the type having electronic components mounted thereon. The size of the workpiece is enlarged for purposes of clarity and does not necessarily represent the size of the $CO_2$ footprint on the PC board or other workpiece to be cleaned.

The reservoir 20 of liquid $CO_2$ is stored at approximately 0° F. and is pumped under a pressure of approximately 300–400 psi through a line 24 through a control valve 22 and then into the $CO_2$ snow generator 10. The control valve 22 regulates the pressure and the flow rate under which the liquid $CO_2$ is fed into the $CO_2$ snow generator 10, which in turn regulates the amount of snow in the output.

The source of "shop air" 30 generally comprises an air compressor and reservoir of the type normally found in a manufacturing or production environment. The air compressor is capable of pumping a large volume of air, typically 200 cfm at room temperature, through a feedline 34. A control valve 32 is interposed along the feedline 34 for regulating the pressure and flow rate of the air from the shop air reservoir 30. The use of existing shop air in the pressure range of 50 psi to 100 psi significantly reduces the initial capital cost of the present system.

A reservoir 40 of liquid nitrogen ($N_2$) is coupled through a supply line 44 into a mixer 50 that allows the liquid nitrogen to be injected into the flow of shop air as required for proper performance of the system. A control valve 42 is inserted into the liquid nitrogen line 44 for controlling the pressure and volume of the liquid nitrogen that mixes with and therefore cools the shop air in the mixer 50. As illustrated generally in FIG. 2, the mixer 50 can be constructed by merely inserting the line 44 carrying the liquid nitrogen into the line 34 transporting the shop air from the reservoir 30 into the $CO_2$ snow generator nozzle, illustrated generally as 60.

Figure 2:
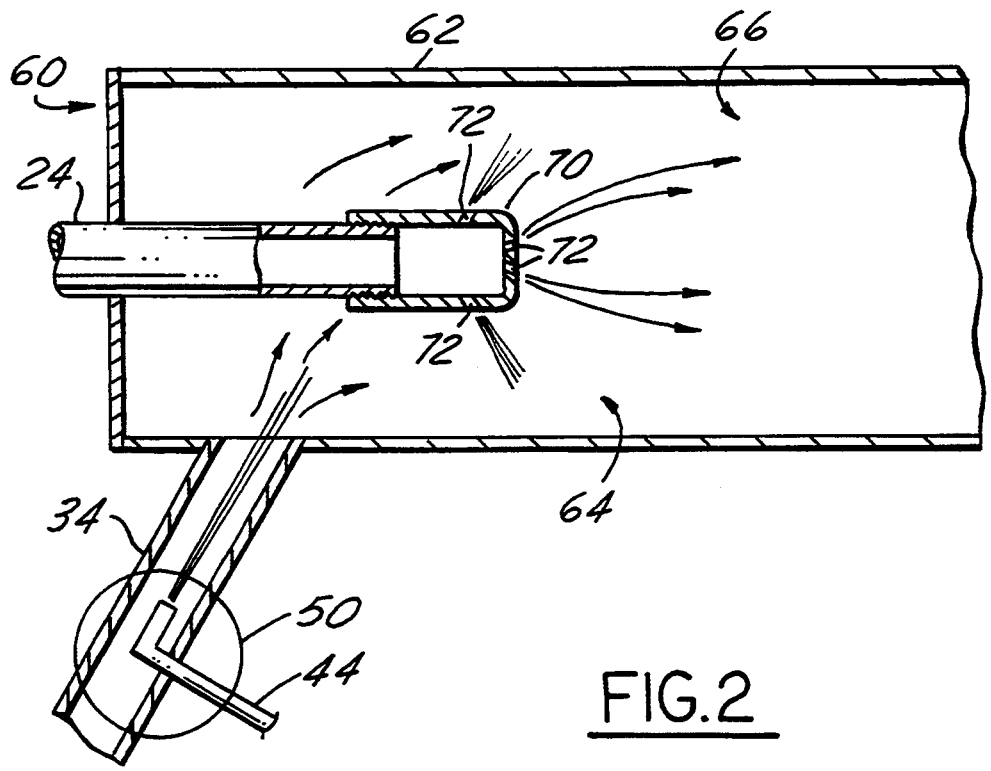
FIG. 2 is a cross-section view of the first preferred embodiment of the $CO_2$ generator nozzle in accordance with the present invention that is contained within the circled portion of FIG. 1 identified with the reference numeral 2.

With continuing reference to FIG. 2, the $CO_2$ snow generator nozzle 60 includes a body 62 having a generally cylindrical shape and defining therein a body cavity 64 having a diameter of approximately 1 to 4 inches, with 4 inches being used in the preferred embodiment, in which the $CO_2$ snow is generated. The cavity 64 is at least 10 to 15 diameters long, which provides a sufficiently restricted volume in which the $CO_2$ snow particles can coagulate to form larger $CO_2$ particles.

The line 24 carrying the liquid $CO_2$ from the reservoir 20 is coupled through the closed end of the body 62 and extends into the body cavity 64 by approximately 4 inches. The body 62 is sealed with the line 24 to allow pressure to accumulate within the body cavity 64. An injector nozzle 70 is coupled to the distended end of the line 24 carrying the liquid $CO_2$. A plurality of orifices 72 are arranged generally around the circumference and on the end of the injector nozzle 70. Whereas the inside diameter of the injector nozzle 70 is approximately $\frac{1}{2}$ inch, the orifices 72 are only 0.04 inches in diameter. The orifices generally comprise bores or channels into the nozzle 70 that are angled with respect to the longitudinal axis of the nozzle 70 and the cavity 64 so that when the liquid $CO_2$ is expelled through the orifices 72, the snow will have some forward velocity toward the elongated section of the cavity 64. The exact angle at which the $CO_2$ snow is expelled through the orifices 72 will vary by design, but in the preferred embodiment is between approximately 30 degrees and 60 degrees with respect to the longitudinal axis.

With continuing reference to FIG. 2, the shop air line 34 from the mixer 50 is coupled into the body 62 of the $CO_2$ snow generator nozzle 60 at a point generally between the closed end of the body and the orifices 72 in the injector nozzle 70. The angle at which the line 34 is coupled into the body 62 not only provides a forward momentum for the shop air as it is introduced under pressure into the cavity 64, but the location and angle of the line 34 with respect to the body 62 also cause the shop air to be directed toward the injector nozzle 70. The inside diameter of the shop air line 34 is approximately 1.25 inches, which in the preferred embodiment is appropriate to provide the volume of shop air to propel the $CO_2$ snow from the system with the appropriate velocity.

The method of operation of the $CO_2$ snow generator 10 will now be explained with continuing reference to FIG. 2. The liquid $CO_2$ is pumped from the reservoir 20 through the feedline 24 under a pressure controlled by the control valve 22. The liquid $CO_2$ is forced under pressure through the orifices 72 in the injector nozzle 70 and thereby "flashes" from the liquid state into a state that includes a solid form of $CO_2$, which herein is referred to generally as $CO_2$ snow. The $CO_2$ snow will be mixed with either liquid $CO_2$ or $CO_2$ in the gaseous form depending on the combination of temperature and pressure as illustrated in the enthalpy diagram of FIG. 4. In the preferred mode of operation, the liquid $CO_2$ will have a temperature of approximately 0° F. and will be pumped through the orifices 72 in the injector nozzle 70 under a pressure of approximately 300 psi. This combination of characteristics is illustrated as point 1 in the enthalpy diagram of FIG. 4. As the liquid $CO_2$ exits the orifices 72, it will move to point 2A on the enthalpy diagram. It will be understood by one skilled in the art that point 2A may be transferred into the area in which the exiting $CO_2$ is in the solid and gaseous phase by increasing the pressure of the gas within the cavity 64, and to point 2C where the exiting $CO_2$ is in the solid and liquid phases by decreasing the temperature of the gas within the cavity 64.

Both of these objectives may be accomplished by either controlling the pressure of the shop air flowing through line 34, or by injecting a controlled volume of liquid nitrogen through the mixer 50 into the shop air to carefully control the resulting temperature of the mixture of gases, or by doing both. Assuming that liquid nitrogen at a temperature of −450° F. is injected into the mixer 50 in a ratio of 15 parts of gaseous nitrogen to 85 parts of air, the shop air at a pressure of 80 psi can be precooled to a temperature in the range of −40° F. to −120° F. As this precooled mixture of shop air and nitrogen is directed toward the nozzle 70, point 2A on the enthalpy diagram in FIG. 4 moves to point 2C which produces more snow and less liquid $CO_2$.

The precooled air and nitrogen mixture flowing through the line 34 from the mixer 50 will also cool the injector nozzle 70 to remove latent heat generated as the liquid $CO_2$ flashes through the orifices 72 in the injector nozzle. This cooling effect also will improve the efficiency of the conversion of the liquid $CO_2$ to snow. The conversion of part of the liquid $CO_2$ injected into the cavity 64 from the liquid state to the gaseous state also adds additional pressure to the shop air in the body cavity 64. This compensates for system pressure losses and increases the pressure at the inlet to the exhaust nozzle 100 by up to approximately 20 percent. This increases nozzle exit velocities, thereby improving the cleaning efficiency of the process.

Figure 3:
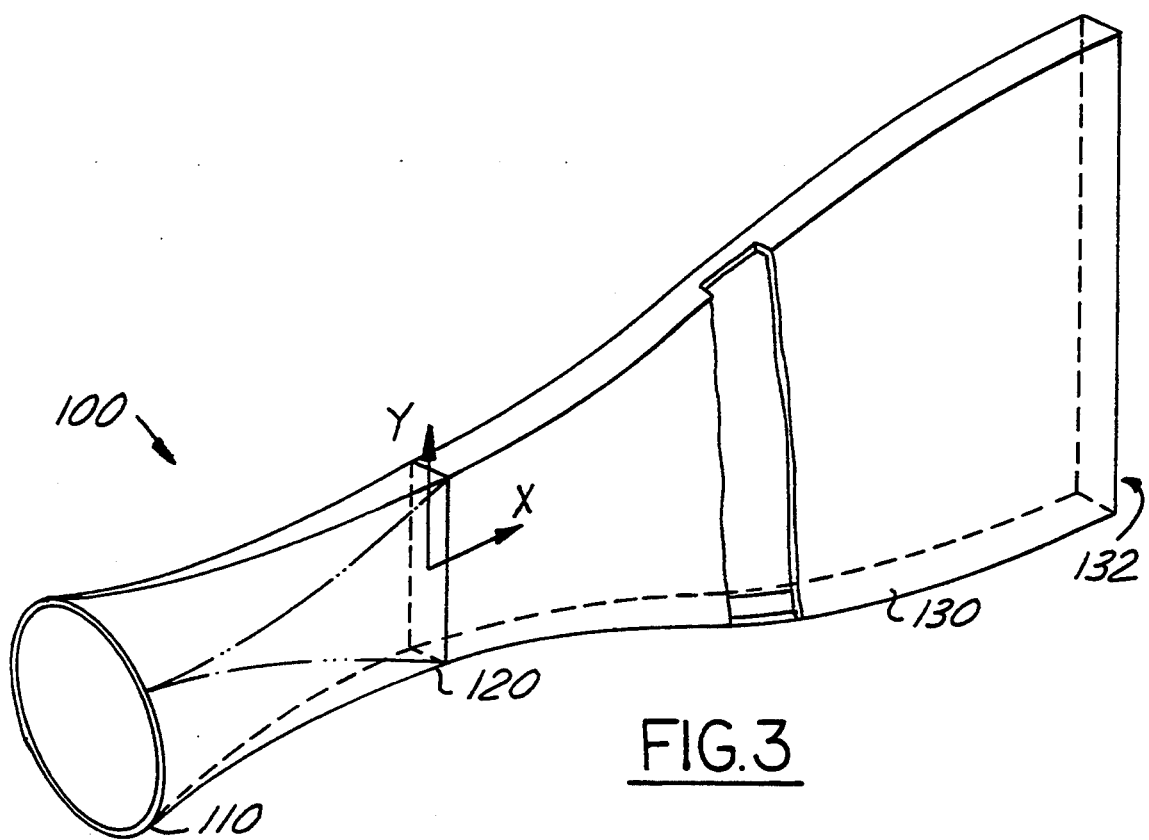
FIG. 3 is a perspective view of a first preferred embodiment of the exhaust nozzle in accordance with the present invention. Hidden lines and cutaway sections reveal the shapes of the interior dimensions of nozzle.

With reference to FIG. 2, the mixture of $CO_2$ snow and gas from the orifices 72 within the injector nozzle 70 are exhausted toward the elongated end 66 of the body cavity 64 within the exhaust gas nozzle 100. The exhaust nozzle 100 expands the stream isentropically to the ambient pressure. Further conversion of any remaining liquid or gaseous $CO_2$ into $CO_2$ snow will occur during this process. As illustrated in FIG. 3, the exhaust nozzle 100 includes a generally cylindrical section 110 that is sized for coupling with the distended section of the body 62 of the $CO_2$ snow generator nozzle 60. This coupling may be accomplished either directly or by the use of a hose 95 of sufficient diameter and length. The cylindrical section 110 is approximately 0.9 inches in inside diameter, and tapers over a length of approximately 6 inches to a throat section 120 that has a generally rectangular cross section approximately 0.9 inches by 0.1 inches. This compound tapering shape between the cylindrical section 110 and the throat section 120 causes a decrease in the pressure of the $CO_2$ snow and gases flowing therethrough. The throat section 120 expands and opens into an enlarged exit nozzle section 130 that defines a generally rectangular exhaust aperture 132 through which the solid $CO_2$ snow and gases flow as they are directed toward the workpiece. The generally cylindrical section 110 of the exhaust nozzle 100 is manufactured of aluminum and is designed to contain and channel a subsonic flow rate of the $CO_2$ gas and snow flowing therethrough. The enlarged exit nozzle 130 is designed to direct a supersonic flow of the $CO_2$ gas and snow from the exhaust aperture 132.

In the present embodiment of the invention, the air, carbon dioxide gas, and snow mixture exiting from the exhaust aperture 132 of the exhaust nozzle 100 has a temperature of approximately $-150°$ F. and a velocity of approximately 1700 feet per second. The output mixture is approximately 10% by mass of solid $CO_2$ snow which has a mean particle size of approximately 100 micrometers. The exhaust nozzle 100 was designed for an inlet pressure of approximately 100 psi and produces and exit flow Mach number of approximately 1.92. The $CO_2$ snow exits at a velocity of approximately 600 feet per second with a generally uniform distribution. The exhaust aperture 132 is designed to be approximately 2 to 6 inches from the workpiece 90. The exhaust gases and snow exiting from the exhaust aperture 132 are generally parallel to the longitudinal axis of the nozzle 100 and do not substantially diverge. While the particle size of the $CO_2$ snow exiting the nozzle 70 is only about 0.0005 to 0.001 inches, as a result of the coagulation and agglomeration process within the elongated cavity 64 the size of the $CO_2$ particles exiting the exhaust nozzle 100 is approximately 0.004 to 0.006 inches. The angle of attack of the snow against the workpiece 90 can be varied from 0° to 90°, with an angle of attack of approximately 30° to 60° being the best for most operations.

Figure 4:
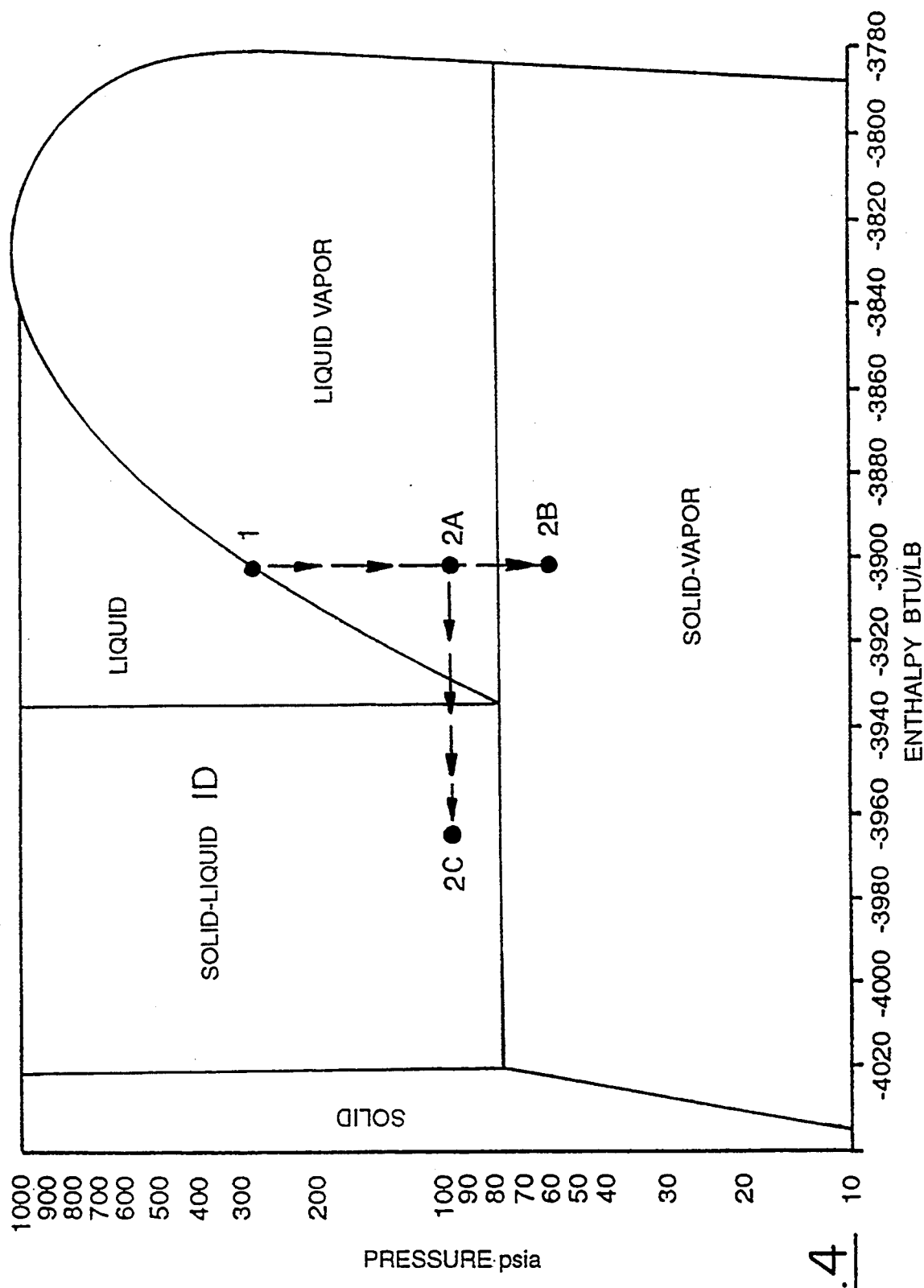
FIG. 4 is an enthalpy diagram showing the transition or flashing of the liquid $CO_2$ into snow in accordance with the operation of the method of the present invention.
Figure 10:
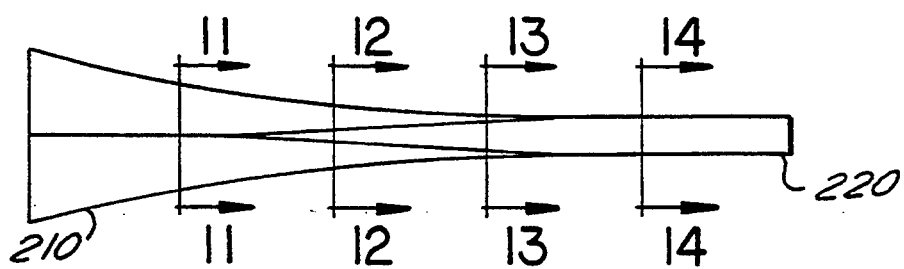
FIG. 10 is a top view of the subsonic section of the improved exhaust gas nozzle.
Figure 11:
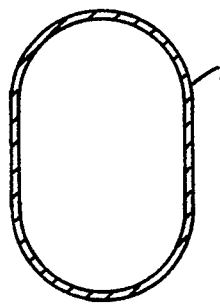
FIGS. 11, 12, 13 and 14 illustrate the cross-sectioned views of the subsonic section of the improved exhaust exhaust gas nozzle taken along the section lines in FIG. 10.
Figure 12:
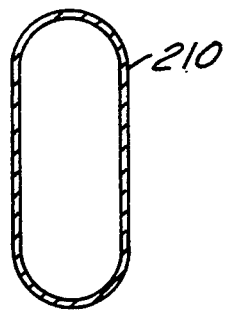
Figure 13:
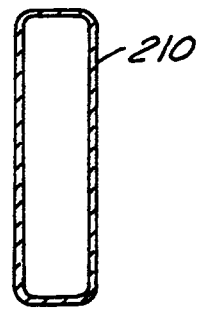
Figure 14:
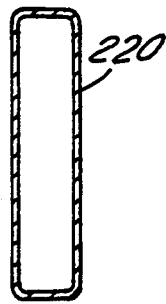

The method of operation of the present embodiment of the $CO_2$ cleaning system will now be explained. Assuming a shop air pressure of approximately 85 psi and an ambient temperature of approximately 75° F., the effect of controlling the pressure and temperature of the gaseous mixture of air and liquid $N_2$ into the mixer 50 can be illustrated with reference to FIG. 4. Point 1 on FIG. 4 represents the state of the saturated liquid $CO_2$ within the nozzle 70 which is controlled by the controller 22 at a pressure of 300 psi and a temperature of approximately 0° F. Point 2A represents a pressure of 100 psi and indicates the state of the $CO_2$ after flashing through the orifices 72 in the injector nozzle 70. The $CO_2$ exiting the nozzle 70 comprises $CO_2$ in both the liquid and gaseous phase having a temperature of approximately $-40°$ F. If the pressure of the shop air in the cavity 64 is adjusted to approximately 60 psi instead of 100 psi at point 2B, then the resulting $CO_2$ exiting from the nozzle 70 will be a combination of solid and vapor, and the temperature of the resulting combination will be approximately $-80°$ F. Therefore, the relative levels of liquid and gaseous $CO_2$ produced in conjunction with the $CO_2$ snow can be controlled by adjusting the pressure of the air in the cavity 64. If the air and nitrogen mixture exiting from the mixer 50 is maintained at a temperature of approximately $-50°$ F., this would cool the $CO_2$ mixture exiting the injector nozzle 70 so that the resulting mixture would be represented by point 2C on FIG. 4, which corresponds to a mixture of solid and liquid phase $CO_2$. Thus, the composition of the $CO_2$ mixture within the cavity 64 can be controlled by adjusting the pressure or the temperature of the air within the cavity 64, or both. The elongated shape of the cavity 64 allows sufficient length for the coagulation of the $CO_2$ snow into larger particles before it enters the exhaust nozzle 100.

During the injection of the liquid $CO_2$ through the injector nozzle into the cavity 64, a boost of up to 15 psi in the pressure within cavity is obtained because of the partial conversion of the liquid $CO_2$ into vapor. This increase in pressure results in an increase in the particle speeds exiting the nozzle 100 by about 10 percent, which further improves the efficiency of the cleaning process.

The inlet pressure at the cylindrical section 110 of the exhaust nozzle 100 can be varied from 40 to 300 psi, although in the preferred embodiment the pressure is designed to be from 60 to 100 psi with a temperature of between $-40°$ to $-100°$ F. The pressure at the exhaust aperture 132 of the exhaust nozzle 130 is designed to be at atmospheric pressure, while the exit temperature is estimated to be approximately $-200°$ F. The percentage of solid to gaseous $CO_2$ entering the exhaust nozzle 100 is estimated to be about 10–40%.

The $CO_2$ snow produced by this embodiment of the present invention was directed at a Koki rosin baked pallet (8" by 14") of the type used in wave-soldering applications. The pallet had a coating of baked Koki rosin flux of approximately 0.005 inches in thickness, and had been through numerous wave-soldering cycles in a manufacturing environment. At a shop air pressure of 85 psi, the Koki rosin flux was completely cleaned from the pallet in about 30 seconds, whereas commercially available $CO_2$ cleaning systems were not able to remove the accumulated flux in a similar period of time. In a similar manner, a 3 inch by 3 inch face of an FR4 printed circuit board of the type used in a speedometer assembly was coated with a combination of fluxes (including Koki) to a depth of approximately 0.003 inches and then was cleaned in approximately 5–10 seconds using the present invention. Finally, an 8 inch by 10 inch glue-plate application fixture of the type used in an electronic manufacturing assembly process was coated with approximately 0.05 inches of rosin glue and then was cleaned in approximately 120 seconds using the present invention. This performance is at least comparable to, if not better than, common available systems utilizing compacted $CO_2$ pellets.

An improved embodiment of the $CO_2$ snow generating nozzle is illustrated generally as 170 in FIGS. 5 and 6 for use in conjunction with the shop air system described above or in systems where air pressures of from 100 to 300 psi are required for imparting additional velocity to the $CO_2$ snow. The $CO_2$ generating nozzle 170 includes six wings or airfoils 180 symmetrically spaced around the circumference of the nozzle body 174. Each wing 180 is approximately 1.2 inches long, and is tapered from 1 inch at the root 185 to 0.8 inches at the tip 187. Each wing 180 is oriented at an angle of approximately 10 to 14 degrees to the direction of the flow of the air past the nozzle, with 12 degrees being the optimum chosen for the preferred embodiment. This 12 degree cant in the relative angle of attack of the wing 180 with respect to the relative wind imparts a swirl or turbulence to the passing air. The central axis of this swirl is generally centered along the central axis of the nozzle.

This angle of attack of the wing with respect to the relative air flow also induces a tip vortex turbulence from the tip 187 of the wing 180. This tip vortex is maximized with the 12 degree angle, but is also operable for other angles within the specified range. The combined swirl and random turbulence induced by the wings 180 improves the mixing action of the $CO_2$ snow downstream of the wings, and therefore significantly enhances the coagulation of the snow flakes. Smaller $CO_2$ snow, having relative sizes in the range of 0.0005 mills to 0.001 mills, coagulate into larger snow particles, having relative sizes in the range of 0.005 mills to 0.015 mills.

While the cross-section of each wing 180, as illustrated in FIG. 6, is symmetric about its central axis for ease of manufacture, the cross-section could be cambered and made non-symmetrical in order to further increase the wake and vortex turbulence actions. Both the wings 180 and the nozzle body 174 are constructed from machined aluminum. Each wing 180 is approximately 0.2 inches in thickness and includes a central passage 189 approximately 0.08 inches in thickness, that is coupled to an internal cavity 176 that in turn is coupled to the liquid $CO_2$ line 24. Several orifices 182, each approximately 0.04 inches in diameter, communicate through the wing 180 from the central passage 189 toward the downstream edge of the wing, and are canted with respect to the central axis of the nozzle 170 by 30 degrees and 45 degrees respectively. This off-axis direction of the ejected $CO_2$ snow imparts momentum components both along and transverse to the direction of the flow toward the exhaust nozzle 130 in order to enhance the mixing effect. By promoting chaotic mixing, the $CO_2$ snow flakes will collide with each other and coagulate in order to develop larger particles of snow. As illustrated in FIG. 5, the larger size of the nozzle 170 requires that the body 62 and the elongated body cavity 64 must be of sufficient size to accommodate the nozzle 170 while maintaining a length to diameter ratio of at least 10 to 15.

This increase in the size of the $CO_2$ particles will result in an improved cleaning action because of the increased velocity and the increased mass of the resulting snow particles. This improved cleaning efficiency may be useful for more rapid cleaning, but may not be appropriate in situations where delicate electrical components are located in the area to be cleaned. The choice between the first and second preferred embodiments of the present invention may depend in large part on the amount of residue to be removed during cleaning, the time available for the cleaning process, and the presence of delicate materials or sensitive components in the vicinity of the area to be cleaned.

Figure 8:
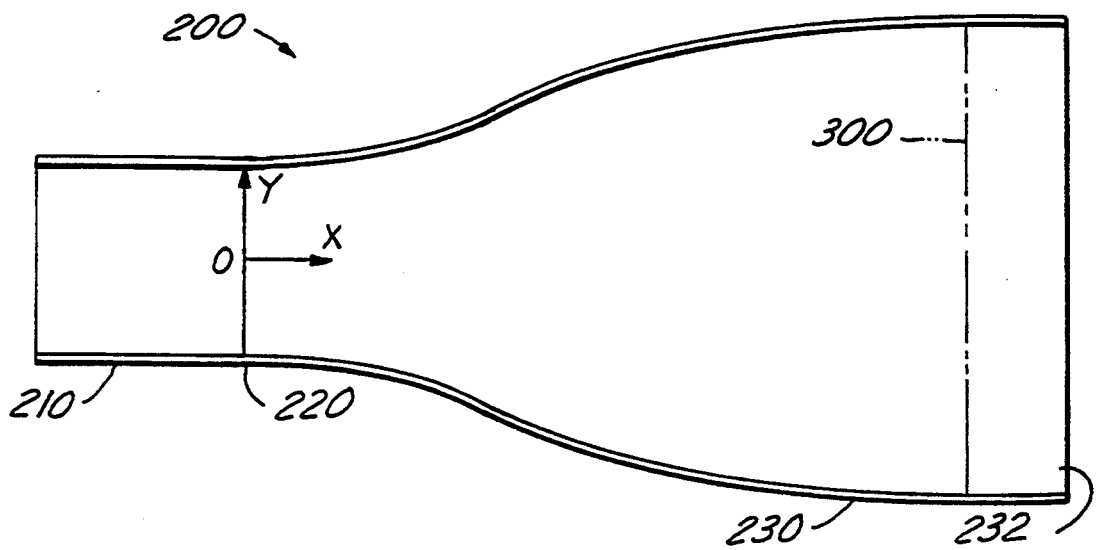
FIG. 8 is a cross-sectioned view of the supersonic portion of an improved exhaust nozzle.

A new preferred embodiment of an exhaust nozzle design having a reduced noise level is illustrated as 200 in FIG. 8. This nozzle 200 has a subsonic section 210 that is similar in form to section 110 of the first preferred embodiment, but which may be tapered in a more optimum manner. The end of the subsonic section 210 is sized for coupling with the distended section 66 of the body 62 of the $CO_2$ snow generator 60. The subsonic section 210 has a length of 4 inches and couples to a throat section 220 that has a generally rectangular cross section of approximately 0.9 inches high by 0.1 inches wide. This tapering will monotonically reduce the cross sectional area of the transition, and does not include abrupt changes in the taper. This compound tapering shape between the cylindrical section 210 and the throat section 220, which is more accurately illustrated in FIGS. 11, 12, 13 and 14, causes a decrease in the pressure and increase in velocity of the air, $CO_2$ snow and gases flowing therethrough. The throat section 220 expands and opens into an enlarged supersonic nozzle section 230 that defines a generally rectangular exhaust aperture 232 through which the solid $CO_2$ snow and gases flow as they are directed toward the workpiece.

The subsonic section 210 of the exhaust nozzle 200 is manufactured of aluminum and is designed to contain and channel a subsonic flow of the air, $CO_2$ gas and snow flowing therethrough. The enlarged exit nozzle 230 is designed to direct the supersonic flow of the air, $CO_2$ gas and snow from the exhaust aperture 232.

The contour or curvature of the inside surface of the subsonic section 210 of the nozzle 200 is designed according to the matched-cubic design procedure described by Thomas Morel in "Design of 2-D Wind Tunnel Contractions", Journal of Fluids Engineering, 1977, vol. 99. According to this design, the air and the gaseous $CO_2$ flow at subsonic speeds of approximately 60 to 1,000 feet per second at temperatures of from $-60°$ F. to $-120°$ F. as it converges at the throat section 220.

The contour or curvature of the inside surfaces of the supersonic section 230 are designed according to a computer program employing the Method of Characteristics as explained by J. C. Sivells in the article "A Computer Program for the Aerodynamic Design of Axisymmetric and Planar Nozzles for Supersonic and Hypersonic Wind Tunnels", AEDC-JR-78-63, that can be obtained from the U.S. Air Force.

The exact contour of the enlarged exit nozzle section 230 are more particularly defined with reference to Table 1 as follows:

| Coordinates of Overexpanded Supersonic Contour | |
|---|---|
| x (in.) | y (in.) |
| 0.0 | 0.452 |
| 0.254 | 0.452 |
| 0.891 | 0.453 |
| 1.477 | 0.461 |
| 2.163 | 0.494 |
| 3.039 | 0.635 |
| 3.866 | 0.967 |
| 4.826 | 1.320 |
| 6.567 | 1.834 |
| 9.438 | 2.402 |
| 11.010 | 2.600 |
| 12.561 | 2.735 |
| 14.636 | 2.841 |
| 16.586 | 2.879 |
| 17.641 | 2.884 |

-continued

| Coordinates of Overexpanded Supersonic Contour | |
|---|---|
| x (in.) | y (in.) |
| 18.000 | 2.885 |

The noise produced by an exhaust nozzle of this type is generated at the shear layer between the high-speed gas flow leaving the exhaust nozzle 230 and the stationary ambient air adjacent the exhaust nozzle aperture 232 and the workpiece 90. The loudness of this noise is roughly proportional to the nozzle exit velocity raised to the fifth power. Under circumstances where the exit velocity from a supersonic nozzle is two or three times the speed of sound, this shear noise can be on the order of 120 decibels as measured 3 feet from the exhaust aperture of the nozzle.

However, the new embodiment of the exhaust nozzle 230 is designed to produce a normal shockwave 300 inside the nozzle 230 so that the exhaust nozzle itself attenuates the noise produced. This may be accomplished by utilizing an overexpanded nozzle design.

The advantages of an overexpanded nozzle can be explained as follows. Supersonic nozzles generally have a contour that converges into a narrow throat section and then diverges at the exhaust opening. The flow in the converging section is subsonic, while the flow in the diverging section is supersonic, with the flow reaching nominal sonic speeds at the throat section. The expansion of the gas through a properly designed supersonic nozzle is generally isentropic. At the design pressure, the pressure at the nozzle exit is equal to the ambient pressure, and the exit flow speed achieves the design exit Mach number within the nozzle. If the nozzle inlet pressure is operated sufficiently below the design pressure, then a normal shockwave is generated within the nozzle instead of at the exhaust nozzle opening or outside of the nozzle. When the exhaust nozzle operates under conditions where the inlet nozzle pressure is below the designed value, then the nozzle is said to be operating in an "overexpanded mode". The flow expansion upstream from the shockwave within the exhaust nozzle is isentropic, and the flow velocity is supersonic.

However, the flow rate abruptly decelerates to subsonic speeds beyond the shockwave, with a simultaneous sharp increase in pressure. The flow leaves the exhaust nozzle at a much slower subsonic speed, thereby significantly reducing the shear noise generated by the exhaust nozzle.

Figure 9:
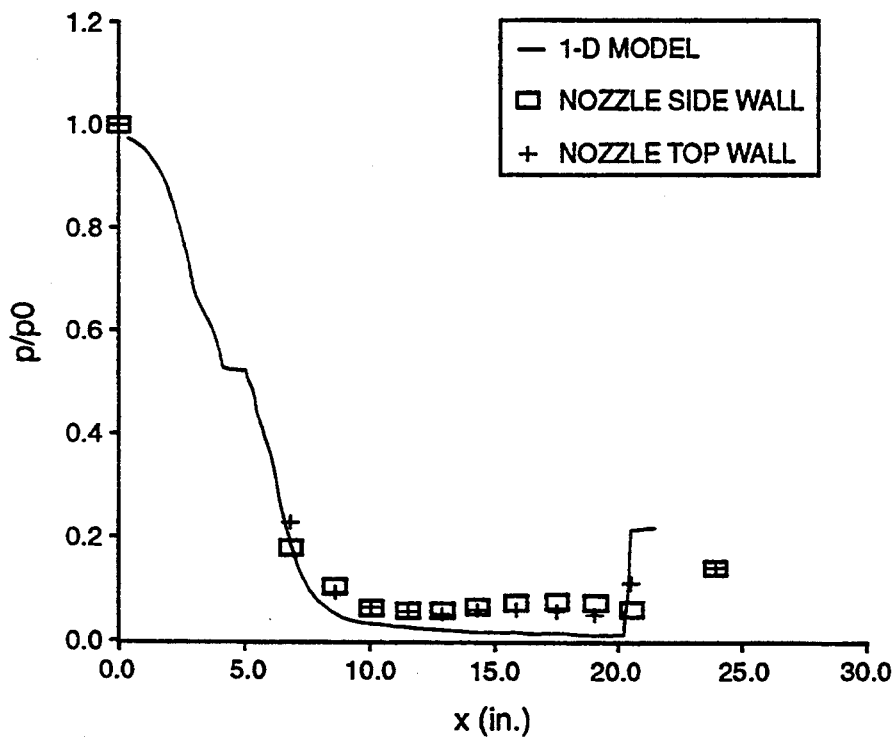
FIG. 9 illustrates the air pressure variations within the improved supersonic section of the exhaust gas nozzle of FIG. 8.

In accordance with this design approach, the subsonic section 210 of the improved exhaust nozzle 200 was designed for an inlet pressure of approximately 800 psi, which would yield an exit Mach number of approximately 3.4 at this input pressure. The length of the supersonic contour, that is the length from the throat section 220 to the exhaust aperture 232, would be 18 inches so that the overall nozzle length would be 22 inches. The exhaust aperture 232 of the nozzle 200 is approximately 5.8 inches by 0.2 inches and has a rectangular shape. According to this design, the improved exhaust nozzle 200 can be operated in an overexpanded mode by maintaining the inlet pressure at approximately 95–100 psi, as compared with the design value of 800 psi. Under these circumstances, the normal shockwave 300 will be observed approximately 3 inches inside the supersonic section 230 and upstream from the exhaust aperture 232. As illustrated in FIG. 9, the relative pressure measurements measured along the top and side-walls of the supersonic section 230 of the exhaust nozzle 200 indicate that the relative pressure begins at 1.0 at the nozzle inlet and decreases with a relatively steep gradient to approximately 0.2 at approximately 7 inches from the nozzle inlet and approximately 0.05 at 10 inches. The relative pressure then holds generally constant until 20–21 inches from the throat, which corresponds to 3–4 inches from the exhaust aperture 232, at which time the relative pressure increases sharply to approximately 0.2. This pressure increase corresponds to the presence of the shockwave 300 within the nozzle.

The noise generated by the improved nozzle design was measured to be approximately 112 decibels at a distance of 3 feet from the nozzle exhaust aperture, as compared to the noise generated by a nozzle not operated in the overexpanded mode which produced a noise level of approximately 121 decibels. This difference represents approximately a 10-fold reduction in the noise generated by the new nozzle, which is perceived by the operator of the equipment as a substantial reduction in the noise level.

The presence of a shockwave 300 within the supersonic section 230 of the exhaust nozzle 200 does not significantly affect the exit speed and cleaning efficiency of the $CO_2$ particles for two reasons. First, since the $CO_2$ particles being carried by the supersonic gases never reach the same speed as the gases, the $CO_2$ particles will be travelling somewhat slower. As the speed of the gases drops to subsonic levels, the $CO_2$ particles will also decelerate but at a slower rate due to their mass. Secondly, under normal operation exhausted gasses would decelerate to subsonic speeds adjacent to the pressure buildup at the workpiece anyway, so the earlier deceleration to subsonic speeds while the particles are still being carried by the exhaust gases should not significantly decrease the cleaning efficiency of the system.

Another advantage of operating the exhaust nozzle 200 in the overexpanded mode is that the footprint produced by the exiting mixture of gas and $CO_2$ snow will be wider than the similar footprint obtained if the exhaust nozzle were to be operated at the designed input pressure. This larger cleaning footprint allows larger areas of the workpiece 91 to be cleaned simultaneously, while not decreasing the efficiency of the cleaning process.

Experimental results of the cleaning capabilities of the improved embodiment 200 of the exhaust nozzle can be summarized as follows. The air and carbon dioxide gas exiting from the exhaust aperture 232 of the exhaust nozzle 200 has a temperature of approximately −150° F. and a velocity of approximately 300 feet per second. The output mixture is approximately 20% by mass of solid $CO_2$ snow which has a particle size of approximately 150 to 350 micrometers. The $CO_2$ snow exits at a velocity of approximately 700 feet per second with a generally uniform distribution. The exhaust aperture 232 is designed to be approximately 2 inches from the workpiece 90. The exhaust gases and $CO_2$ snow exiting from the exhaust aperture 232 are generally parallel to the longitudinal axis of the nozzle 200 and do not substantially diverge. The angle of attack of the snow against the workpiece 90 can be varied from 0° to 90°, with an angle of attack of approximately 30° to 60° being the best for most operations.

The $CO_2$ snow produced by this embodiment of the present invention was directed at a Koki rosin baked pallet (8" by 14") of the type used in wave-soldering applications. The pallet had a coating of baked Koki rosin flux of approximately 0.005 inches in thickness, and had been through numerous wave-soldering cycles in a manufacturing environment. At a shop air pressure of 85 psi the Koki rosin flux was completely cleaned from the pallet in about 20 seconds, whereas commercially available $CO_2$ cleaning systems were not able to remove the accumulated flux in a similar period of time. In a similar manner, the 3 inch by 3 inch face of an FR4 printed circuit board of the type used in a speedometer assembly coated with a combination of fluxes (including Koki) to a depth of approximately 0.003 inches was cleaned in approximately 5 to 10 seconds using the present invention. Finally, an 8 inch by 10 inch glue-plate application fixture of the type used in an electronics manufacturing assembly process, which was coated with approximately 0.05 inches of rosin glue was cleaned in approximately 120 seconds using the present invention. This performance represents a faster cleaning process than commercially available systems using $CO_2$ snow.

While the present invention has been particularly described in terms of specific embodiments thereof, it will be understood that numerous variations of the invention are within the skill of the art and yet are within the teachings of the technology and the invention herein. Accordingly, the present invention is to be broadly construed and limited only by the scope and spirit of the following claims.

I claim:

1. An apparatus for cleaning a workpiece with abrasive $CO_2$ snow, comprising in combination:
    a nozzle for receiving and ejecting liquid $CO_2$ through at least one orifice sized for converting the liquid $CO_2$ into solid $CO_2$ snow,
    a body defining a cavity therein, with said nozzle being coupled to said body for ejecting the $CO_2$ snow into said cavity,
    first means, coupled to said body, for injecting pressurized air into said cavity for carrying the $CO_2$ snow from said orifice in said nozzle, and
    an exhaust nozzle including a subsonic section coupled to said cavity within said body for receiving the $CO_2$ snow and air under pressure therefrom, a throat section and a supersonic section for directing the air and $CO_2$ snow toward the workpiece, with said supersonic section being operated in the overexpanded mode for containing the shockwave therein, thereby reducing the noise produced by the pressurized air and $CO_2$ snow exiting said exhaust nozzle.

2. The apparatus as described in claim 1 wherein said supersonic section of said exhaust nozzle is shaped to cause the deceleration of the mixture of air and $CO_2$ snow from supersonic to subsonic speeds fully within said exhaust nozzle, whereby the exhaust nozzle shields the sonic noise therewithin.

3. A method for cleaning a workpiece with abrasive $CO_2$ snow, comprising:
    receiving $CO_2$ in a liquid form at a first pressure and temperature,
    passing the liquid $CO_2$ through an orifice in a nozzle for changing the $CO_2$ from the liquid phase along a constant entropy line to a mixture of $CO_2$ liquid and $CO_2$ snow,
    injecting pressurized air into a cavity adjacent the nozzle for receiving and mixing with the $CO_2$ snow,
    collecting the resulting $CO_2$ snow and pressurized air within the cavity and then accelerating the mixture to supersonic speeds through a converging/diverging exhaust nozzle, with the diverging section of the exhaust nozzle having a contour for directing the flow of the $CO_2$ snow toward the workpiece, and then
    decelerating the air within the diverging section of the exhaust nozzle to subsonic speed, thereby generating a normal shockwave within said exhaust nozzle and suppressing shear layer noise.

4. The method as described in claim 3 wherein the injecting step includes the additional step of injecting liquid $N_2$ into the pressurized shop air and then directing the mixture of pressurized shop air and $N_2$ onto an area of the nozzle operatively adjacent to the aperture therein for removing latent heat resulting from the flashing to the $CO_2$ from liquid to snow from the nozzle.

5. The method as described in claim 3 wherein the air is decelerated from supersonic speed to subsonic speed within the exhaust nozzle without significantly decelerating the $CO_2$ snow as it exists the exhaust nozzle.

6. The method as described in claim 3 wherein the step of injecting pressurized air into the cavity includes the substep of generating a swirling turbulence generally along a longitudinal axis within the cavity for improving the coagulation of the $CO_2$ snow into larger $CO_2$ particles therein.

* * * * *